United States Patent [19]

Mourier

[11] Patent Number: 5,266,910
[45] Date of Patent: Nov. 30, 1993

[54] DIRECTIONAL COUPLER ON MIRROR ELBOW FOR MICROWAVES

[75] Inventor: Georges Mourier, Mariel sur Mauldre, France

[73] Assignee: Thomson Tubes Electroniques, Boulogne Billancourt, France

[21] Appl. No.: 865,371

[22] Filed: Apr. 8, 1992

[30] Foreign Application Priority Data

Apr. 19, 1991 [FR] France ............... 91 04860

[51] Int. Cl.$^5$ ................ H01P 1/02; H01P 5/18
[52] U.S. Cl. ..................... 333/113; 333/249
[58] Field of Search ........... 333/109, 111, 113, 114, 333/249

[56] References Cited

U.S. PATENT DOCUMENTS

| | | | |
|---|---|---|---|
| 2,519,734 | 8/1950 | Bethe | 333/113 |
| 3,090,315 | 5/1963 | Marcatili | 333/249 |
| 3,999,151 | 12/1976 | Baldwin | 333/114 |
| 4,025,878 | 5/1977 | Predmore | 333/113 |
| 4,504,806 | 3/1985 | Conn et al. | 333/249 X |

FOREIGN PATENT DOCUMENTS 2448229  8/1980  France .
1185451 10/1985  U.S.S.R. ............... 333/113

OTHER PUBLICATIONS

Japanese Journal of Applied Physics, vol. 13, No. 2 Feb. 1974, pp. 296–305.
IEEE Transactions on Nuclear Science, vol. 32, No. 5, Oct. 1985, N.Y., N.Y., pp. 2921–2923.
NTIS Tech Notes. Oct. 1988, Springfield, Va. US. p. 863.

Primary Examiner—Benny T. Lee
Attorney, Agent, or Firm—Roland Plottel

[57] ABSTRACT

Disclosed is a directional coupler on a mirror elbow for a microwave transmission line sized to convey very high power. The coupler consists of a main guide with a mirror elbow and at least one secondary guide. The secondary guide is joined by one of its walls to the external surface of the mirror, and the interior of the secondary guide is joined to the interior of the mirror elbow by coupling holes.

8 Claims, 7 Drawing Sheets

"PRIOR ART"

DIRECTIONAL COUPLER ON MIRROR ELBOW FOR MICROWAVES

BACKGROUND OF THE INVENTION

1. Field of the Invention

An object of the present invention is a mirror elbow or bend having a directional coupler for very high power microwave transmission lines. Microwave power transmission lines find application notably in plasma physics or, in thermonuclear fusion where it is often necessary to convey very high power values of electromagnetic energy, at millimetrical or infra-millimetrical wavelengths, over fairly large distances which may sometimes go to tens of meters, the transmission being done from microwave power generators to equipment using the power which may be a tokamak for example.

2. Description of the Prior Art

A known way of reducing transmission losses is to use oversized waveguides as transmission lines. Specific elements are used to deflect the direction of propagation of the electromagnetic energy within the transmission line (for example through elbows) or again to change its mode of propagation (for example, through mode converters, corrugated oversized guides, etc.).

In lower power transmission lines, there is a known method that uses a directional coupler (FIG. 1) to tap a part of the transmitted energy or, in reverse, to tap a part of the reflected energy. A calibration of the coupler makes it possible, by measuring the tapped energy, to compute the power conveyed by the transmission line itself.

A standard directional coupler includes a waveguide joined to the main waveguide of the transmission line, coupled to this main waveguide by a series of coupling holes distributed over a length L (FIG. 1). The standard coupler of FIG. 1 may be characterized by two parameters:

1) the coupling factor $C = P_3/P_1$ and
2) the directivity $D = P_3/P_4$ measured at $P_2 = 0$ (zero reflected power)

where:
- $P_1$ = incident power in the main wave guide
- $P_2$ = reflected power from the output in the main wave guide
- $P_3$ = tapped incident power in the secondary wave guide
- $P_4$ = tapped reflected power in the secondary wave guide While it may be easy to make a standard coupler in the case of the rectangular main guides that work in fundamental propagation modes or have a low propagation value (e.g., the mode of propagation in a wave guide can be $TE_{xy}$ and the indices x,y have a low value), this is not the case for special guides used to convey the very high power required for thermonuclear fusion. Indeed, applications such as these often use oversized guides that are circular-sectioned, smooth or corrugated, possibly surrounded by a vacuum chamber or a coating that enables the walls of the guide to be cooled by a circulating liquid or gas to remove the heat generated in the conductive walls of the waveguide by microwave losses.

The structure of a microwave power transmission line formed by guides of this kind is complicated and hardly allows for the addition of a secondary guide to form a standard coupler as shown schematically in FIG. 1.

An object of the present invention is to overcome this difficulty by proposing a coupler with a novel design that does not have these drawbacks.

A very high power transmission line almost always has elbows, generally close to the generator or to the using equipment. This is for practical reasons of prime importance. For example, the generator is often of the gyrotron type, namely an electron tube that generally works in a vertical position and has its energy coming out of it vertically. To convey its energy to the equipment. Using this power, which may be positioned at a distance tens of meters away in a horizontal direction, at least one elbow would be necessary. Similarly, near the user equipment (a tokamak for example), a large number of microwave transmission lines converge from the different sources and have to be coupled to the user equipment. These transmission lines are positioned among other devices (such as probes, gas sources, various supplies, electro-magnets, cooling equipment, lasers etc. which may give rise to phenomena of mechanical interference. The phenomena of mechanical interference will then be circumvented by means of elbows placed in the transmission line close to the user equipment.

For high power values and high frequencies (and hence short wavelengths), mirror elbows are frequently used. These have a structure, two prior art examples of which are shown, schematically in FIGS. 2 and 3.

SUMMARY OF THE INVENTION

To overcome the difficulties of making couplers for high power and high frequency transmission lines encountered in the prior art, the invention proposes the making of a directional coupler using a main waveguide comprising a mirror elbow capable of changing the direction of propagation of an electromagnetic wave from a first incident direction $Z_1$ to a second outgoing direction $Z_2$, where $Z_1$ and $Z_2$ define a plane (Q) containing $Z_1$ and $Z_2$, the mirror of the mirror elbow being positioned perpendicularly to said plane (Q) of the mirror elbow. At least one secondary waveguide is joined and coupled to the main waveguide at the mirror by means of coupling holes.

The secondary guide will have four sides. Of these four sides, two relatively wider sides will face each other and two relatively narrower side will face each other.

According to one characteristic of the invention, the secondary guide may be joined to the mirror by one of its large sides. This guide will work in $TE_{01}$ or similar mode.

Or else, it may be joined to the mirror by one of its small sides. This guide will work in a $TE_{10}$ or similar mode.

According to another characteristic of the invention, when two secondary guides are joined to the mirror, one may be joined to the mirror by a small side and the other by a large side.

The mirror may be plane or curved so as to eliminate the divergence resulting from the incidence of a spherical wave on a plane mirror. In the curved configuration, the secondary waveguide will therefore be slightly curved to fit the curvature of the mirror.

In all the variants of the invention, the making of a directional coupler for a high power microwave transmission line at very high frequencies is very greatly simplified in comparison with the known embodiments of the prior art. Furthermore, the orientation of the directional coupler may be used to sample a precise polarization within the main guide. Finally, according to the last characteristic mentioned, it is easy to make a two-channel coupler to sample two orthogonal polarization simultaneously in a particularly simple device, hence one that is easy to manufacture and is relatively less costly.

In all the variants of the invention, the space occupied by the device and the risks of mechanical interference with the other components of the system are considerably reduced.

BRIEF DESCRIPTION OF THE DRAWINGS

Other features and advantages of the device of the coupler according to the invention will emerge from the following detailed description, and from the appended figures of which.

The figures exemplify non-restrictive embodiments. The same references are used designate the same elements in the different figures. Other embodiments according to the invention or its main characteristics will be easily imagined by those skilled in the art, on the basis of the principles illustrated by the examples given here below.

MORE DETAILED DESCRIPTION

Figure 1:
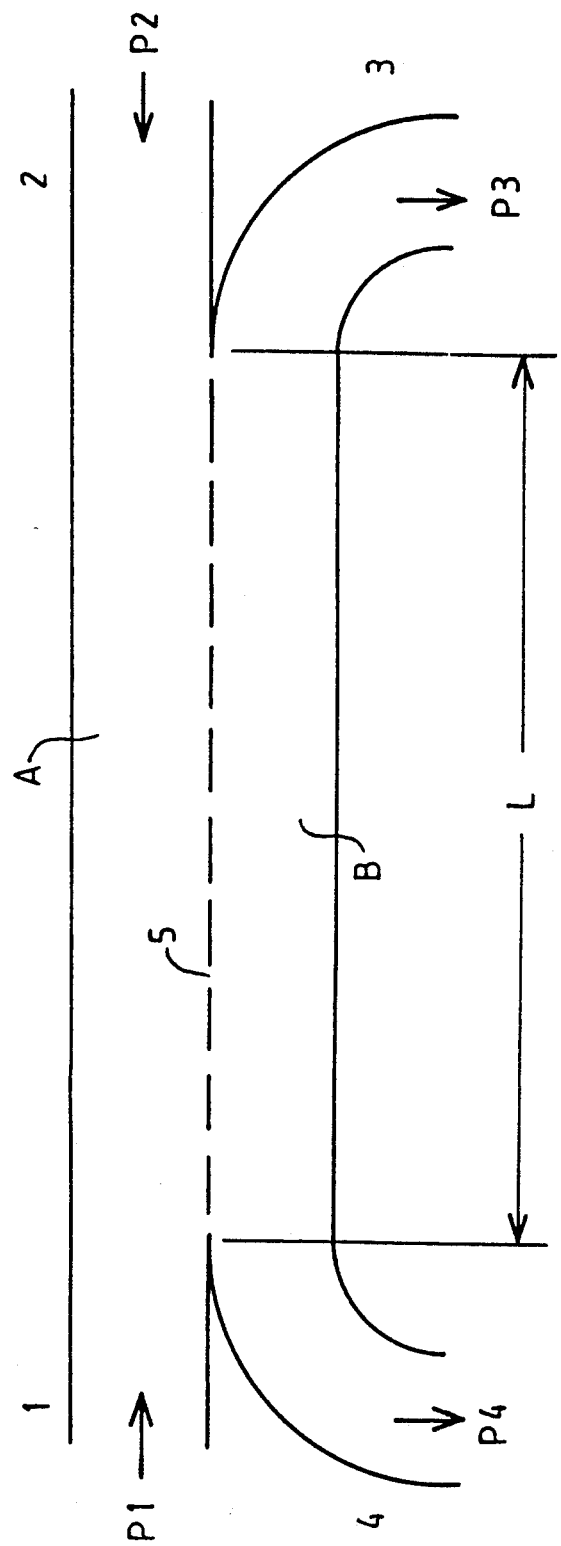
FIG. 1, already referred to, shows a schematic view in axial section of a known prior art multiple-hole directional coupler.

FIG. 1 shows a schematic view, in axial section, of a multiple-hole directional coupler known in the prior art. In the drawing, it is seen that the coupler generally consists of two waveguides. These are:

a first waveguide called a main waveguide A having a first end 1 for the input of incident power $P_1$ coming from a microwave generator (not shown) and a second end 2, from which the output power is conveyed towards the user equipment (not shown) which, in the case of an imperfect matching of user equipment, reflects a reflected power $P_2$ towards the coupler, and a second waveguide called a secondary waveguide B having a first end 3 for the tapping of a part $P_3$ of the incident power $P_1$ and a second end 4 for the tapping of a part $P_4$ of the reflected power $P_2$.

The main waveguide A and the secondary waveguide B are joined along a part of their walls, lengthwise and in the direction in which the energy is propagated within the guides, and coupling holes 5 are made through these joined walls, over a length L, to enable the tapping of a part of the energy flowing within the main guide A towards the secondary guide B.

The energy thus tapped towards the secondary guide B is proportional to the energy flowing within the main guide A, in a ratio that depends on the number, size and arrangement of the coupling holes 5. This ratio may be determined experimentally by calibration measurements and, following a calibration such as this, the coupler may be used to ascertain the incident power $P_1$ and the reflected power $P_2$ with a high degree of precision.

The making of a coupler such as this is relatively easy when the main guide A and the secondary guide B have rectangular sections and are rectilinear over a length of several centimeters to enable the juxtaposition of the two guides. Couplers such as these are commonly available in the market for use at frequencies ranging from some hundreds of MHz to hundreds of GHz, for values of power $P_1$ ranging from mW to tens or even hundreds of kW.

If the main guide A has a circular section with a smooth wall, the embodiment is only slightly complicated provided that the radius of the section of the guide A is not excessively small. By contrast, the interpretation of the measurements of the power $P_3$ and the power $P_4$ flowing in the secondary guide B may be complicated by the possible existence of several modes of propagation within the circular main guide, for the coupling coefficient is not necessarily the same for all these modes.

If the main guide A has a circular section and is corrugated along its length, then the making of a standard coupler becomes very difficult if not impossible.

To convey very high power (of several MW) at very high frequencies (on the order of 100 GHz), the oversized circular guide is preferably used, but the making of standard couplers has the above-mentioned difficulties. The coupler according to the invention is aimed at overcoming these difficulties of manufacturing and use encountered in the prior art.

Figure 2:
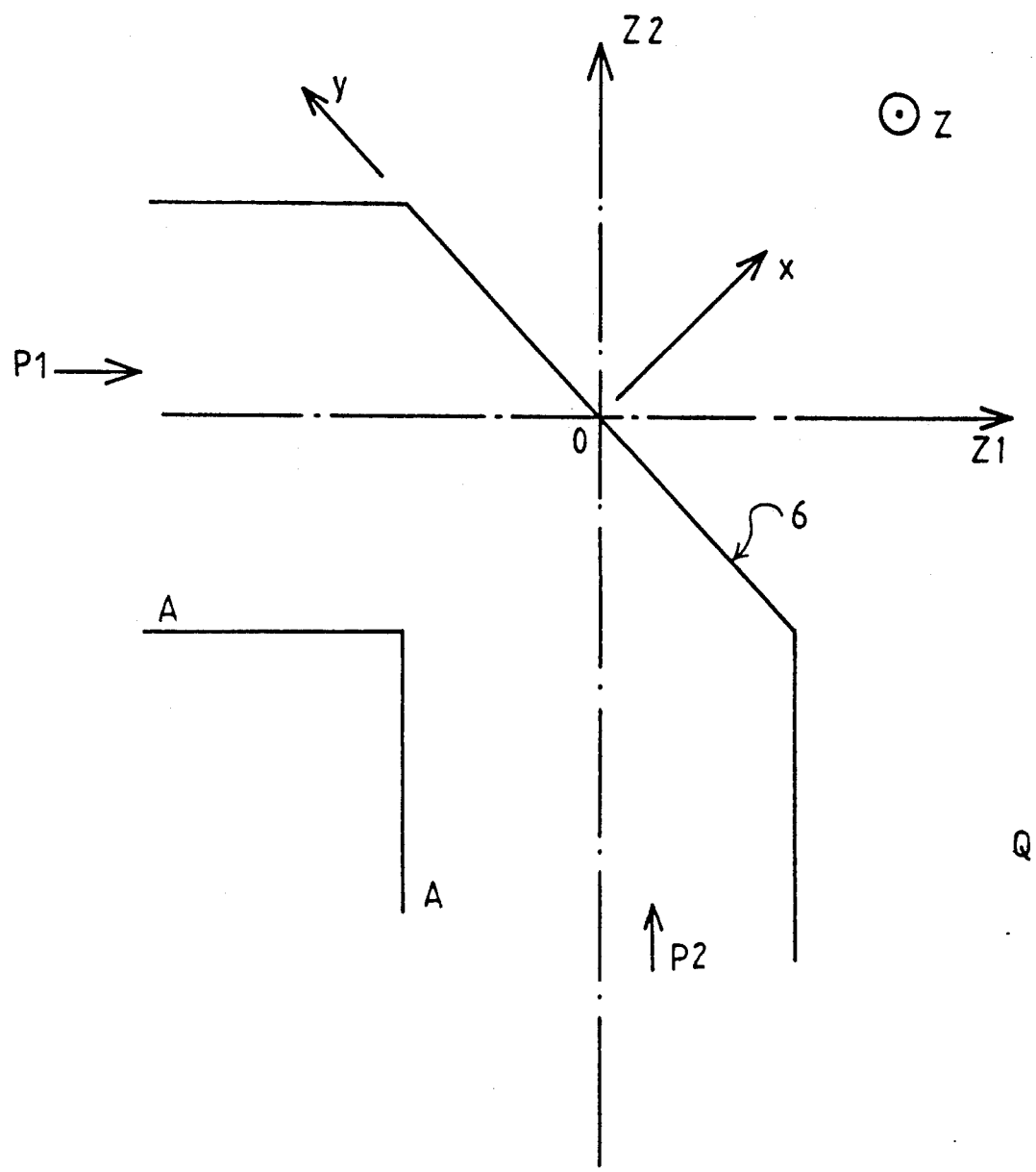
FIG. 2 shows a schematic sectional view of a standard mirror elbow of the prior art, used to change the direction of propagation within the transmission line.

FIG. 2 shows a schematic sectional view, in the plane Q, of a simplified example of a known prior art mirror elbow for a microwave transmission line, with a system of Cartesian coordinates that will be useful for the following description. In the very simple example of a mirror elbow shown in this figure, the main waveguide A has a constant section upline and downline with respect to a 90° elbow, for which the change in the direction of propagation is obtained by a plane mirror 6, the geometrical center 0 of which is located at the origin of the system of coordinates used herein. The main waveguide is symmetrical, except in the region of the elbow, about an axis indicated by dots and dashes in the drawing. Thus, the origin 0 of the present system of coordinates is at the intersection of the axis of the upline part with the axis of the downline part of the main waveguide A.

The Cartesian axes x and y are in the plane Q which contains the two axes of symmetry (upline and downline) of the main waveguide A, i.e. in the median plane of the main waveguide A. The axis x is perpendicular to the mirror 6 and is directed towards the exterior of the main waveguide A. The axis y, in the same median plane Q of the elbow, is at 90° with respect to the axis x, in the anti-clockwise direction. And, following standard practice, the axis z goes out of the plane of the drawing in a direction perpendicular to the axes x and y. To simplify the following explanation, two axes $Z_1$ and $Z_2$ are also defined, along the two axes of symmetry (upline and downline respectively) of the main waveguide A. The axis $Z_1$ is oriented in the direction of propagation of the incident energy $P_1$, along the axis of the main waveguide upline, towards the mirror 6, and the axis $Z_2$ is oriented in the direction of propagation of the reflected energy $P_2$, along the axis of the main waveguide downline, towards the mirror 6. For the purposes of explanation, special attention is paid to the propagation, in $HE_{11}$ mode, of approximately plane waves in this system. In order to provide an instructive and realistic example, corrugated circular guides or guides with dielectric internal coating are used.

The incident wave on the mirror with power $P_1$ will have a magnetic field $H_1$ that varies approximately as:

$$H_1 = H_0 \exp(jwt) \exp(-jz_1 w/c)$$
$$= H_0 \exp(jwt) \exp(-j(x-y)2^{-\frac{1}{2}}w/c)$$

where:
$H_0$ is a function of amplitude that is real and slowly variable in space and
$j = (-1)^{+\frac{1}{2}}$
$w = 2\pi.f$ where f = frequency of the radiation, and
$\pi = 3.14159 \ldots$
c = speed of light
t = time
and x, y and $z_1$ are the above defined coordinates.

The magnetic field H may have an arbitrarily defined polarization, which may be considered to be a linear superimposition of two orthogonal polarizations, one of which has a magnetic field perpendicular to the plane of the figure along the axis z and the other one of which has a magnetic field in the plane of the figure (along the axis y as shall be demonstrated further below).

Should the magnetic field follow the axis z, the magnetic field due to the wave reflected by the mirror has the expression:

$$H_2 = H_0 \exp(jwt) \exp(j(x+y)2^{-\frac{1}{2}}w/c),$$

and the total field $H_m$ on the surface Of the mirror (x=0):

$$H_m = H_1 + H_2 = 2H_0 \exp(-j(y)2^{-\frac{1}{2}}w/c),$$

and to obtain a phase that is constant on the surface of the mirror, the latter equation shows us that it is necessary for $t + 2^{-\frac{1}{2}}y/c$ to be constant, which indicates a wave that moves forward on the surface of the mirror in the direction −y at the speed $2^{\frac{1}{2}}c$.

By a similar demonstration for a wave $P_2$ reflected by the user load towards the mirror in the direction $z_2$, it can easily be seen that this wave will be reflected by the mirror in the direction $-z_1$ and will appear to get propagated on the surface of the mirror in the direction +y at the speed $2^{\frac{1}{2}}c$.

Figure 4:
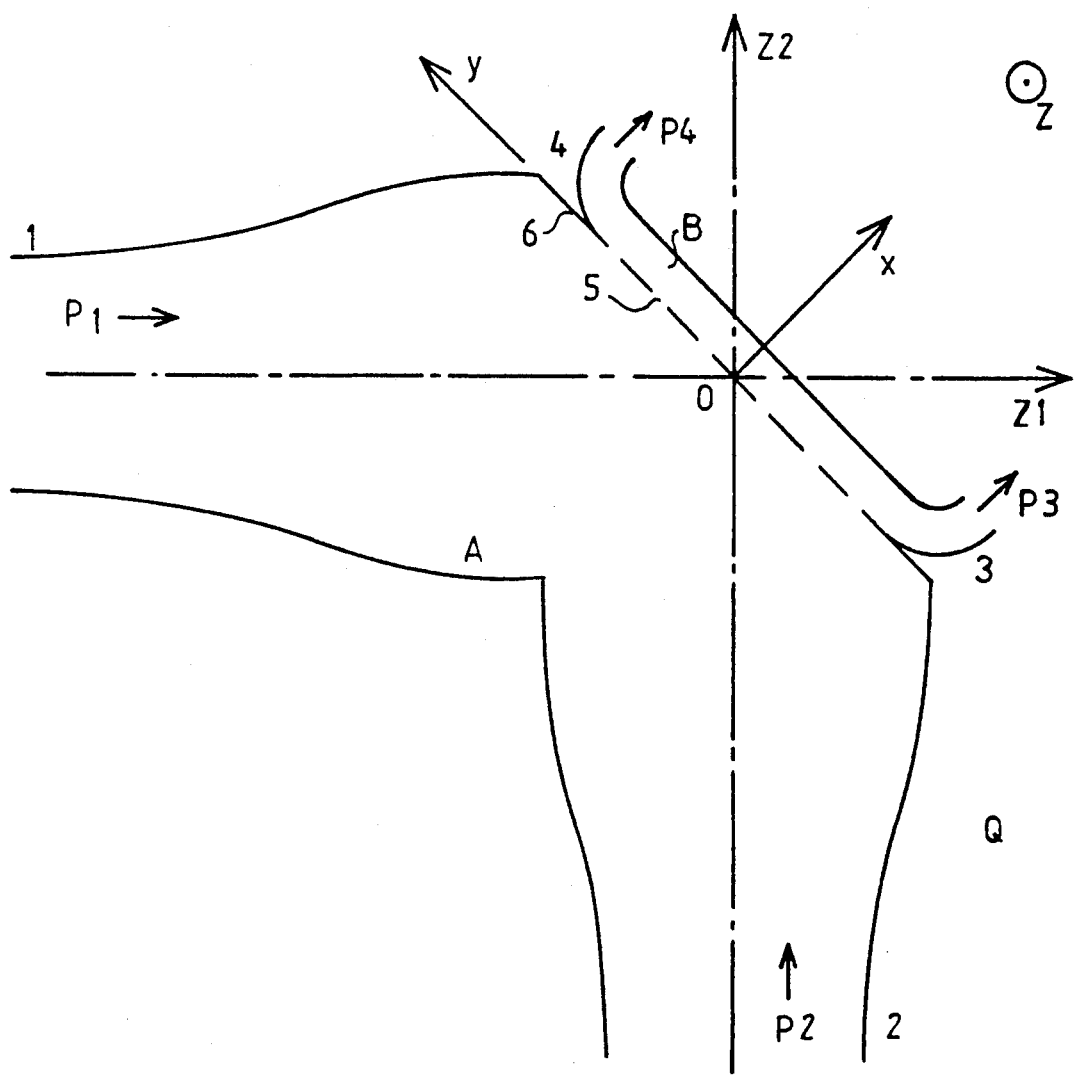
FIG. 4 shows a schematic sectional view of a device according to the invention, comprising a directional coupler coupled to a mirror elbow by coupling holes.

Thus, it is seen that the speed of propagation of the incident wave in the direction $z_1$ differs from the speed of the wave reflected in the direction $z_2$, on the surface of the mirror, by the sign: the first one along −y and the second one along +y. This property enables the construction of a directional coupler on the surface of the mirror by the addition of a secondary guide oriented in parallel to the axis y, coupled by holes as shall be seen further below (FIG. 4).

By contrast, should the magnetic field be in the plane of the figure, the incident wave will have two components $H_{x1}$ and $H_{41}$ along the axes x and y:

$$H_{x1} = 2^{-\frac{1}{2}}H_0 \exp(jwt) \exp(-jz_1 w/c)$$
$$= 2^{-\frac{1}{2}}H_0 \exp(jwt) \exp(-j(x-y)2^{-\frac{1}{2}}w/c)$$

and $$H_{y1} = 2^{-\frac{1}{2}}H_0 \exp(jwt) \exp(-jz_1 w/c)$$
$$= 2^{-\frac{1}{2}}H_0 \exp(jwt) \exp(-j(x-y)2^{-\frac{1}{2}}w/c),$$

with similar forms for the reflected wave. On the surface of the mirror (x=0), the component $H_{41}$ and $H_{42}$, parallel to the plane of the mirror, is reflected without reversal of sign: $H_{y1}(x=0) = H_{y2}(x=0)$; and the component $H_{x1}$ and $H_{x2}$ perpendicular to the plane of the mirror is reflected with reversal of sign: $H_{x1}(x=0) = H_{x2}(x=0)$. This condition on the surface of the mirror determines the fields throughout space: i.e. the reflected wave $H_{x2}$ and $H_{y2}$, for any x, has the form:

$$H_{x2} = -2^{-\frac{1}{2}}H_0 \text{esp}(jwt)\text{esp}(j(x+y)2^{-\frac{1}{2}}w/c), \text{ and}$$

$$H_{y2} = 30 \; 2^{-\frac{1}{2}}H_0 \text{esp}(jwt)\text{esp}(j(x+y)2^{-\frac{1}{2}}w/c),$$

for x=0, at the surface of the mirror, $$H_x = H_{x1} + H_{x2} = 0, \text{ and}$$

$$H_y = H_{y1} + H_{y2}$$

$$H_y = 2^{-\frac{1}{2}}H_0 \exp(jwt) (\text{esp}(j(x+y)2^{-\frac{1}{2}}w/c)$$

$$+ \exp(-j(x-y)2^{-\frac{1}{2}}w/c),$$

$$H_y = 2^{+\frac{1}{2}}H_0\text{esp}(jwt)\text{esp}(jy \; 2^{-\frac{1}{2}}w/c) \cos(2^{-\frac{1}{2}}wx/c),$$

which indicates a wave that moves forward on the surface of the mirror in the direction −y at the speed $2^{\frac{1}{2}}$, but with the magnetic field directed along the axis y. It is also noted that the amplitude of the resultant fields in the case of the fields in the plane of the figure is different from the case where the fields are parallel to the axis z with a ratio of $2^{+\frac{1}{2}}$.

Figure 3:
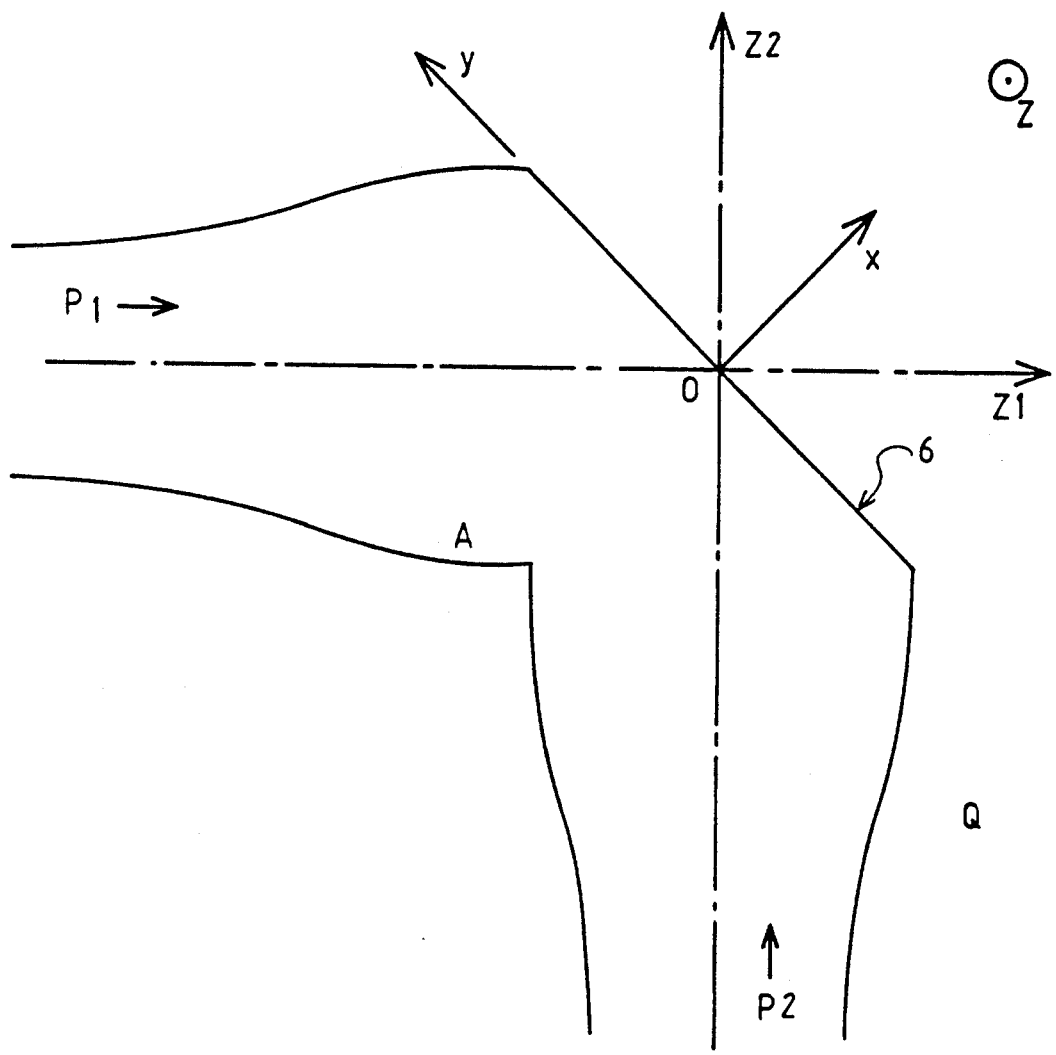
FIG. 3 shows a schematic sectional view of another prior art mirror elbow, designed to minimize the effects of diffraction in the region of the mirror.

FIG. 3 gives a schematic sectional view of a more realistic example of a mirror elbow known in the prior art for a microwave transmission line, using the same system of Cartesian coordinates as in FIG. 2. In this FIG. 3, it is seen that the section of the main guide varies along its length for the following reason.

The discussion of FIG. 2 used the approximation of the plane waves reaching the surface of the mirror and overlooked the effects of diffraction of the waves at their exit from a straight guide section. This diffraction introduces a distortion of the wave front, and the approximation made does not represent the real situation with sufficiently high precision. The particular shape of the guide shown in FIG. 3 makes it possible to correct the distortion due to the diffraction in the vicinity of the elbow, with the result that the waves reaching the surface of the mirror are sufficiently plane for the computations explained here above to be quite exact.

FIG. 4 gives a schematic sectional view of an exemplary device according to the invention, comprising a directional coupler coupled to a mirror elbow by means of coupling holes 5. The mirror elbow is similar to the prior art elbows shown in FIGS. 2 and 3, and the same system of Cartesian coordinates has been chosen to describe it. As above, the power $P_1$ is incident along the axis $z_1$ and is then reflected at 90° by the mirror 6 in the direction of the axis $z_2$. These axes of propagation $z_1$ and $z_2$ are in the same plane Q as the axes x and y used in the foregoing field computations. The plane Q sections the device of FIG. 4 into two symmetrical parts but this is not necessarily the case in the other exemplary embodiments according to the invention (see FIG. 7 for example).

The exemplary embodiment according to the invention, shown in FIG. 4, is made by fixing a rectangular secondary guide B to the mirror 6, outside the elbow (x>0), in such a way that a wall of the rectangular secondary guide B is joined, along a part of its length, to the exterior of the mirror 6, and coupling holes 5 will enable the coupling of the energy circulating within the main guide A with the interior of the secondary guide B as in a standard coupler. However, as was seen when computing the fields in the discussion of FIG. 2, the orientation of the fields, hence the relative orientation of the guides and modes of propagation of the energy circulating in the main guide, have an influence on the coupling that may be obtained. This effect may be exploited to our advantage as shall be explained further below (FIGS. 5 and 6).

The rectangular secondary guide B will have four walls, two of them relatively wider and two of them relatively narrower. A single wall will be joined to the mirror 6 and will be pierced with the coupling holes 5. By an ingenious choice of the widths of these walls, and of the wall which will be joined to the mirror 6 and pierced with the coupling holes 5, the guide may be sized to work in a fundamental mode, at the frequency of operation of the main guide, with a phase speed equal to or close to $(2)^{\frac{1}{2}}C$.

Figure 5:
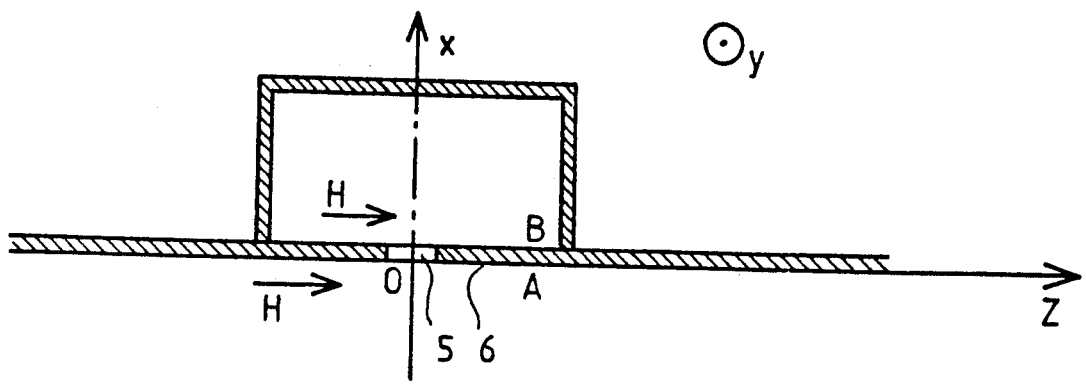
FIG. 5 shows a schematic sectional view of a detail of a rectangular secondary guide, joined to the mirror and coupled with holes through the mirror and the large side of said secondary guide.

FIG. 5 shows a schematic sectional view, along a plane containing the axes x and z defined here above, of a detail of a device according to the invention. The figure shows a portion of the mirror 6 with a coupling hole 5 enabling the coupling of the interior of the main guide A with the interior of the secondary guide B. According to the first assumption examined in the computations made in the discussion of FIG. 2, the magnetic field H is oriented along the axis z, the relatively wider wall of the secondary guide B is joined to the mirror and the secondary guide B is excited in the $TE_{01}$ mode.

Figure 6:
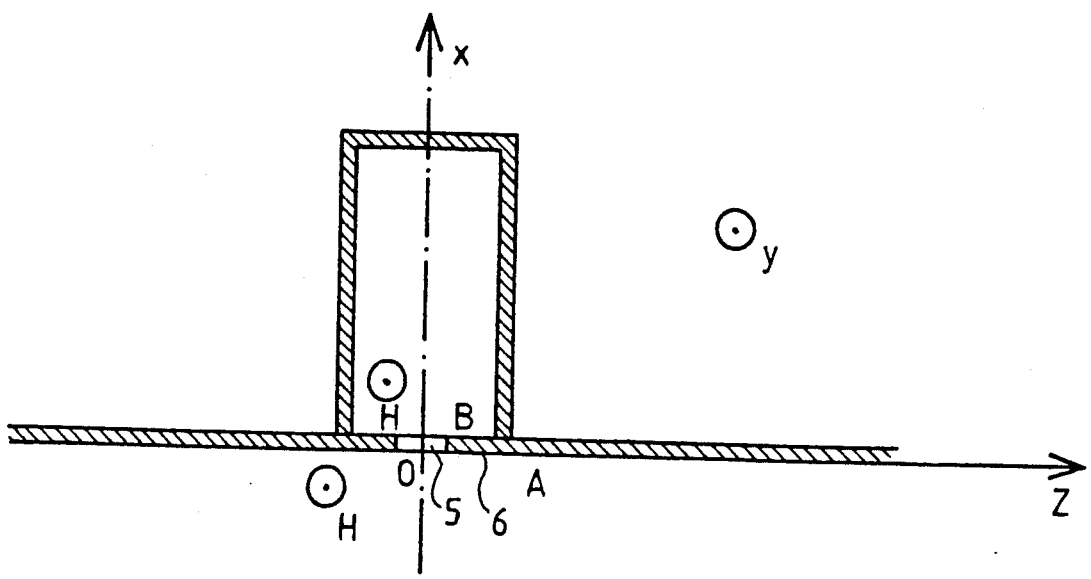
FIG. 6 shows a schematic sectional view of a detail of a rectangular secondary guide, joined to the mirror and coupled with holes through the mirror and the small side of said secondary guide.

FIG. 6 shows a schematic sectional view, along a plane containing the axes x and z defined here above, of a detail of another device according to the invention. The figure shows a portion of the mirror 6 with a coupling hole 5 enabling the coupling of the interior of the main guide A with the interior of the secondary guide B. According to the second assumption examined in the computations made in the discussion of FIG. 2, the magnetic field H is oriented along the axis y, the relatively narrower wall of the secondary guide B is joined to the mirror and the secondary guide B is excited in the $TE_{10}$ mode.

Figure 7:
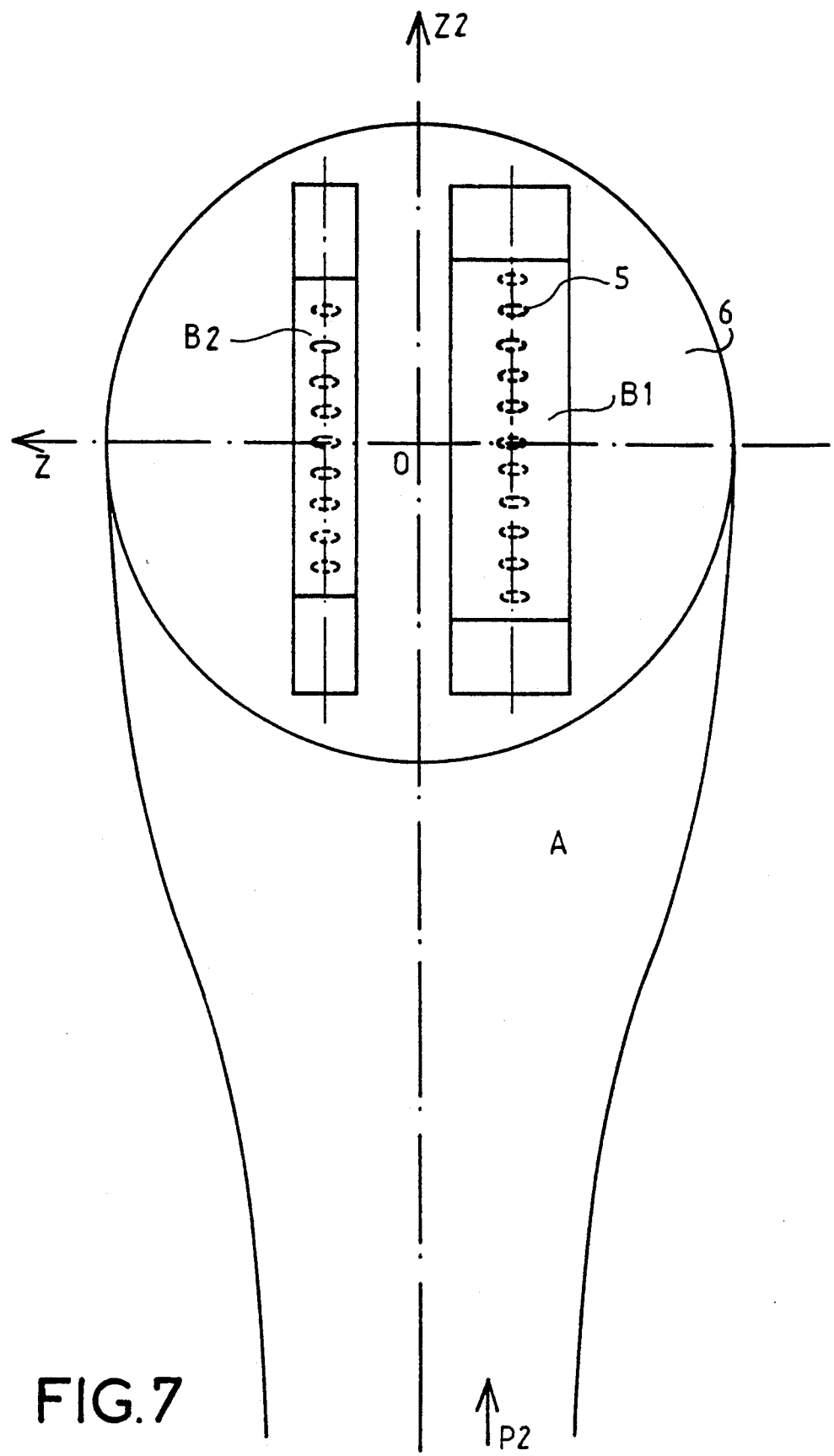
FIG. 7 shows a schematic plane view of a device according to the invention, wherein two secondary guides are joined to the mirror of a mirror elbow, the two guides being oriented in such a way that one of them is joined to the mirror by a relatively narrower wall of the rectangle while the other is joined to the mirror by a relatively larger wall of the rectangle, enabling the sampling of the two orthogonal polarizations simultaneously.

FIG. 7 gives a schematic plane view of another exemplary embodiment, according to the invention, of a directional coupler with two secondary guides $B_1$ and $B_2$, oriented respectively with the relatively larger wall joined to the mirror 6 ($B_1$) and with the relatively less large wall joined to the mirror 6 ($B_2$). We therefore have a combination of the two embodiments shown in FIGS. 5 and 6, with the guide $B_1$ working in $TE_{01}$ mode and the guide $B_2$ working in $TE_{10}$ mode. The guide $B_1$ is sensitive to the polarization parallel to the axis z of the magnetic field H in the main guide A, and the guide $B_2$ is sensitive to the polarization (orthogonal to the other polarization) parallel to the axis y of the magnetic field H in the main guide A. This device can thus be used for the simultaneous measurement of the incident power $P_1$ and the reflected power $P_2$ in the two polarizations.

Figure 8:
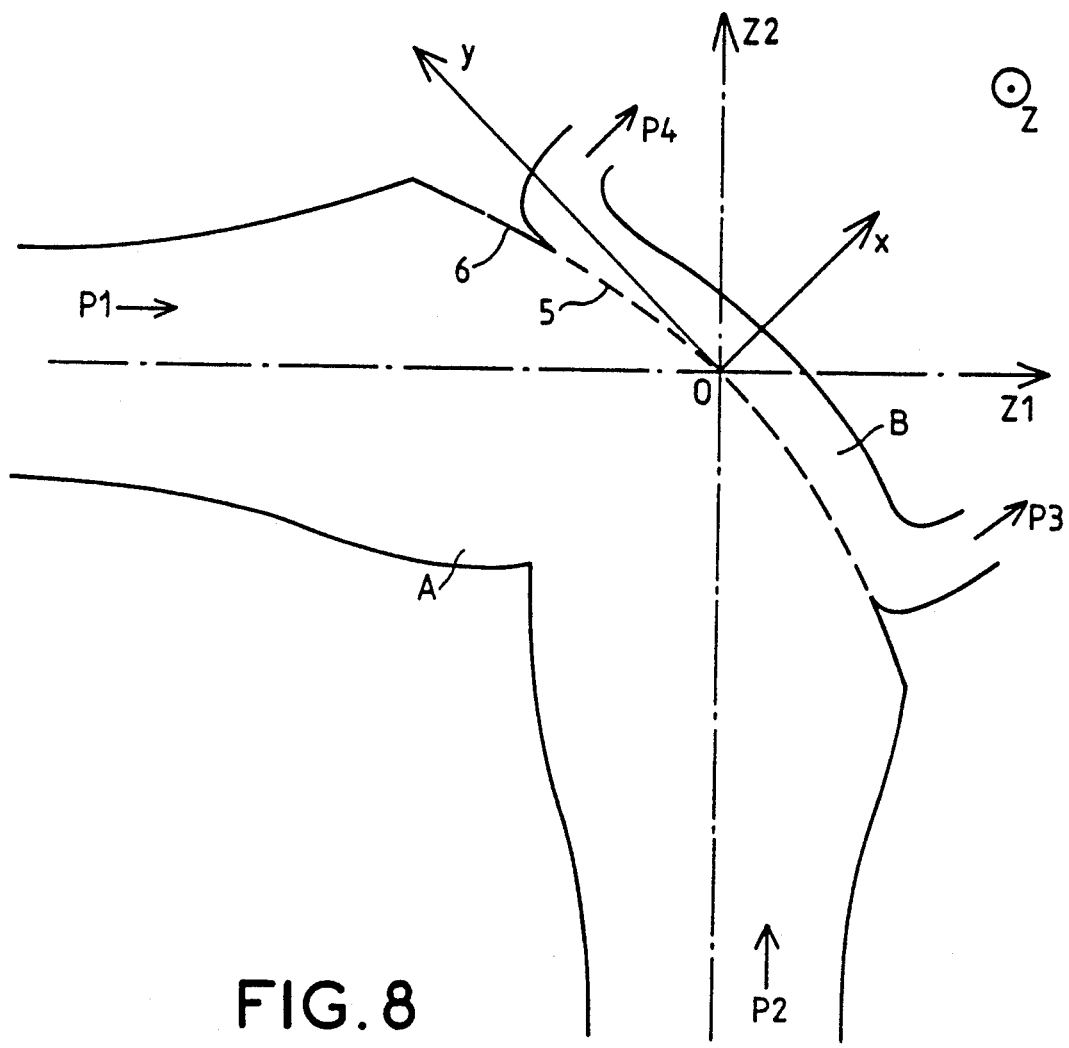
FIG. 8 shows a schematic view of a coupler according to the invention with a curved mirror.

In FIGS. 4 to 7, it was assumed that the mirror 6 was plane. An example may be envisaged where it is curved. It may, for example, have elliptical generatrices in two perpendicular directions. This configuration is shown in FIG. 8. For example, the surface of the curved mirror is generated by the displacement of an ellipse having an axis parallel to y, and by the displacement of an ellipse having an axis parallel to z. The surface of the curved mirror has two curved radius and they are elliptical. In this configuration, the secondary waveguide B is curved to match the curvature of the mirror 6. This structure can be used to eliminate the divergence that appears during the incidence of a spherical wave on a plane mirror.

what is claimed is:

1. A high power microwave directional coupler comprising a main waveguide conveying microwave high power and at least one secondary waveguide attached and electromagnetically coupled to the main waveguide, wherein the main waveguide comprises a mirror elbow portion, the secondary waveguide being attached to the main waveguide at the mirror elbow portion, the mirror elbow portion and the secondary waveguide being electromagnetically coupled to each other through coinciding coupling holes defined therebetween.

2. A direction coupler according to claim 1, wherein the secondary waveguide has two small sides opposite to each other operatively connected to two large sides opposite to each other.

3. A directional coupler according to claim 2, wherein one large side of the secondary waveguide is attached to the mirror, the large side having therein said coupling holes, the secondary waveguide being excitable in a transverse magnetic propagation mode.

4. A directional coupler according to claim 2, wherein one small side of the secondary waveguide is attached to the mirror, this small side having therein said coupling holes, the secondary waveguide being excitable in a transverse magnetic propagation mode.

5. A directional coupler according to claim 1, wherein the mirror elbow portion has a curvature.

6. A directional coupler according to claim 5, wherein the secondary waveguide is curved to match the curvature of the mirror elbow portion.

7. A directional coupler according to claim 1, wherein the mirror elbow portion is planar.

8. A high power microwave directional coupler comprising a main waveguide conveying high power microwave electromagnetic radiation and two secondary waveguides attached and electromagnetically coupled to the main waveguide, the main waveguide having a mirror elbow portion, the secondary waveguides being attached to the main waveguide at the mirror elbow portion, the mirror elbow portion and the secondary waveguides being electromagnetically coupled to each other through concentric coupling holes defined therebetween, said two secondary waveguides each having two opposite small sides and two opposite large sides, one secondary waveguide being attached to the mirror portion by a large side, and the other secondary waveguide being attached to the mirror portion by a small side.

* * * * *